United States Patent [19]

Wu

[11] Patent Number: 5,817,558

[45] Date of Patent: Oct. 6, 1998

[54] METHOD OF FORMING A T-GATE LIGHTLY-DOPED DRAIN SEMICONDUCTOR DEVICE

[75] Inventor: Shye Lin Wu, Hsinchu County, Taiwan

[73] Assignee: Acer Semiconductor Manufacturing Inc., Hsichu, Taiwan

[21] Appl. No.: 988,035

[22] Filed: Dec. 10, 1997

[30] Foreign Application Priority Data

Jun. 20, 1997 [TW] Taiwan ................................. 86108729

[51] Int. Cl.$^6$ ..................... H01L 21/336; H01L 21/3205; H01L 21/4763
[52] U.S. Cl. ......................... 438/291; 438/589; 438/306
[58] Field of Search .................................. 438/305, 585, 438/589, 574, 579, 177, 291, 306–307

[56] References Cited

U.S. PATENT DOCUMENTS

| | | | |
|---|---|---|---|
| 4,830,975 | 5/1989 | Bovaird et al. . | |
| 4,939,100 | 7/1990 | Jeuch et al. . | |
| 4,959,326 | 9/1990 | Muller et al. | 437/40 |
| 5,155,053 | 10/1992 | Atkinson | 437/40 |
| 5,405,787 | 4/1995 | Kurimoto | 437/28 |
| 5,552,329 | 9/1996 | Kim et al. . | |
| 5,580,803 | 12/1996 | Oh et al. | 437/40 |
| 5,688,704 | 11/1997 | Liu . | |
| 5,698,461 | 12/1997 | Liu | 438/305 |
| 5,736,435 | 4/1998 | Venkatesan et al. | 438/151 |

*Primary Examiner*—Richard A. Booth
*Attorney, Agent, or Firm*—Robert H. Chen

[57] ABSTRACT

A semiconductor processing method for forming self-aligned T-gate Lightly-Doped Drain (LDD) device of recessed channel is presented. The method comprises the steps of covering a substrate with pad oxide, forming a lightly-doped layer by ion implantation, depositing a silicon nitride layer on the surface of the pad oxide, and etching the silicon nitride layer according to a predefined mask pattern to expose the silicon oxide layer and to form a gate region. A polysilicon spacer region is formed on the side-walls of the silicon nitride layer. Anisotropic etch is used to etch the polysilicon spacer region, and at the same time etch the exposed pad oxide and a portion of the substrate to form a T-shaped groove. An amorphous silicon layer is deposited in the T-shaped groove after forming a thin oxide layer, then the amorphous silicon deposited apart from the T-shaped groove region is removed. The silicon nitride layer is removed to form a T-gate. Ion implantation is used to form a heavily-doped source/drain, and finally metal contacts are formed on the polysilicon T-gate and the heavily-doped source/drain regions.

20 Claims, 3 Drawing Sheets

METHOD OF FORMING A T-GATE LIGHTLY-DOPED DRAIN SEMICONDUCTOR DEVICE

BACKGROUND OF THE INVENTION

1. Field of the Invention

This invention relates generally to a semiconductor processing method, and more particularly to a process for forming a self-aligned T-gate MOSFET with a recessed channel, utilizing a polysilicon spacer structure to form a T-shaped groove to produce a Lightly-Doped Drain (LDD) silicon T-gate MOSFET device.

2. Background of the Invention

In the miniaturization of MOSFETs, as ULSI technology progresses, deep sub-micrometer processing techniques are applied. Decreasing the channel length of a MOSFET, may produce a channel hot carrier effect which will influence the performance of the device. This effect is caused by the high electric field generated within the channel region when the channel length is shortened, so high energy electrons produce impact ionization near the drain of the device, resulting in avalanche breakdown. Electrons and holes with high energy penetrate the gate oxide and a gate current is generated. Some of the charges will be trapped into the gate oxide and change the transistor characteristics, for example the threshold voltage (Vt) of the device.

Using an LDD structure can reduce the channel hot carrier effect. The LDD structure comprises a lightly-doped buffer region between the heavily-doped drain region and the gate region, which disperses the electric field of channel and the drain region. Using the LDD structure typically results in a reduction of 30% of the electric field strength, which prevents the generation of high energy particles. The first step of processing T-gate LDD structure is, generally, doping low energy phosphorus ions (5~60 KeV) to form the N– region, which concentration is about $5*10^{12}-3*10^{15}$ ion/cm$^2$, and then to form a recessed groove by dry etching within N– region. The top region of T-gate shields a portion of LDD region against ion implantation impacting, which masks to form the N+ region implanting highly concentrated arsenic ions.

In semiconductor lithography, various mask patterns differentiate between the parts that are to be etched away and the parts that are to be preserved. Diffraction effect results in the blurring of the boundary regions of the mask pattern, when the line width of the mask patterns is approximately that of the light wavelength. Therefore, the size of the devices manufactured by lithography method is limited by the wavelength. It is difficult to produce a device with dimensions below 0.1 micrometer by simply using conventional lithography methods. To solve this problem, methods in the prior art have been proposed to use a spacer as part of the etching mask to solve the problems arising from light diffraction.

Prior art methods utilize tungsten for the gate material filled in the T-gate groove are defined by the oxide spacers. References include "A Sub-0.1 μm Grooved Gate MOSFET with High Immunity to Short-Channel Effect" by Junko Tanaka, Shin'ichiro Kimura, Hiromasa Noda, Toru Toyabe, and Sigeo Ihara, IEDM [TITLE], 1993. One of the defects in the prior art methods is the height of the T-gate extending from the surface of substrate to above oxide spacer wall and thereby influences the planarization of the devices. This will produce defects in processing metal contacts and/or multi-layer devices. Further, the tungsten material cannot stand up to high temperatures and is thus comparatively unstable because some of the tungsten atoms can osmose to the silicon substrate during thermal processing steps. Prior art methods also include the use of polysilicon to form the T-gate, but it is difficult to miniaturize below 0.1 micrometer. References include "Sub-Half-Micrometer Concave MOSFET with Double LDD Structure," by Katsuhiko Hieda, Ksumasa Sunouchi, Heroshi Takato, Akihiro Nitayama, Fumio Horiguchi, Fujio Masuoka, IEEE Transactions on Electron Devices, Vol.39, NO.3, March 1992.

SUMMARY OF THE INVENTION

The present invention is an improved semiconductor processing method for forming T-gate LDD devices and making devices smaller, more compact and more planarized. The method comprises the steps of utilizing polysilicon for a portion of the etching mask, etching to form ultra-short recessed channel, and utilizing the highly selective etching characteristics between polysilicon and silicon oxide to form a perfect T-shaped groove which is to be filled with the gate material.

The present invention comprises the steps of forming a pad oxide layer on the silicon substrate, and forming a lightly doped layer by using ion implantation. A silicon nitride layer is deposited on the pad oxide. According to the mask pattern resulted from the exposed resist, the groove is formed by etching the silicon nitride layer and exposing the pad oxide layer as a gate region. The polysilicon spacer is formed on side walls of a silicon nitride groove. By using an anisotropically etching method, the exposed pad oxide layer and the substrate are removed, and the polysilicon spacer is etched to form a T-shaped groove at the same time. An amorphous silicon layer is deposited to be filled in the T-shaped groove, and the amorphous silicon which is apart from T-shaped groove is removed by etching process. The silicon nitride layer is removed, and only the amorphous silicon T-gate remains. Use of ion implantation forms the heavily doped sources, drains and metal contacts which are on the amorphous silicon T-gate and a portion of the heavily doped source and drain.

DESCRIPTION OF THE INVENTION

Figure 1:
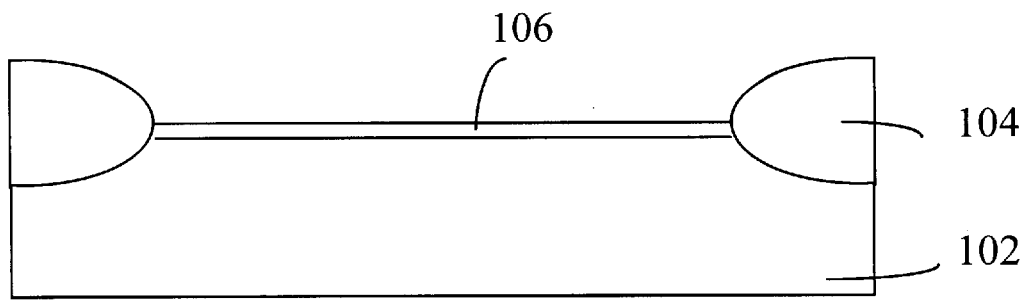
FIG. 1 is a schematic diagram of forming a silicon oxide layer and a pad oxide layer on the substrate according to the present invention.

FIG. 1 shows, in cross-section, a silicon substrate 102, an upper layer of field oxide 104 and a pad oxide layer 106 between one of two field oxide layers 104. The thickness of field oxide layer 104 is approximately 3000–10000 angstroms and the thickness of the pad oxide layer 106 is in the range of 100–300 angstroms.

Figure 2:
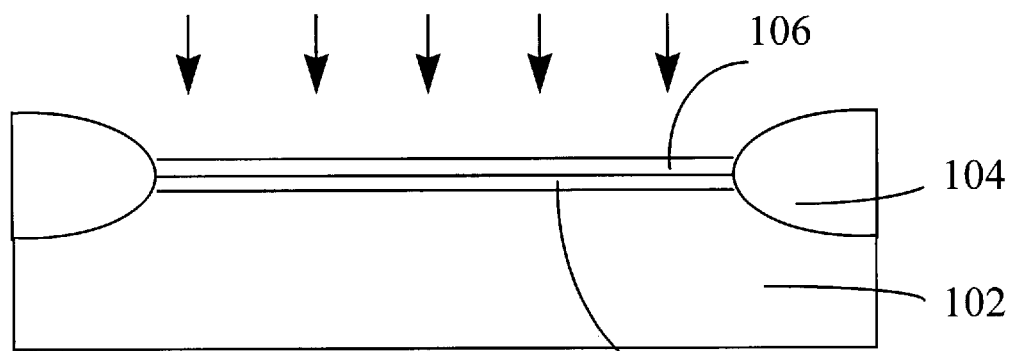
FIG. 2 is a schematic diagram of using ion implantation for forming a N-type or P-type lightly doped layer according to the present invention.

FIG. 2 shows the pad oxide layer 106 utilizing ion implantation to form an N– lightly doped layer 202, which will used for forming an LDD structure. The energy of the ion implantation is typically 5–100 KeV and the concentration of the phosphorous dopant is $5*10^{12} \sim 1*10^{14}$ ions/cm$^2$.

Figure 3:
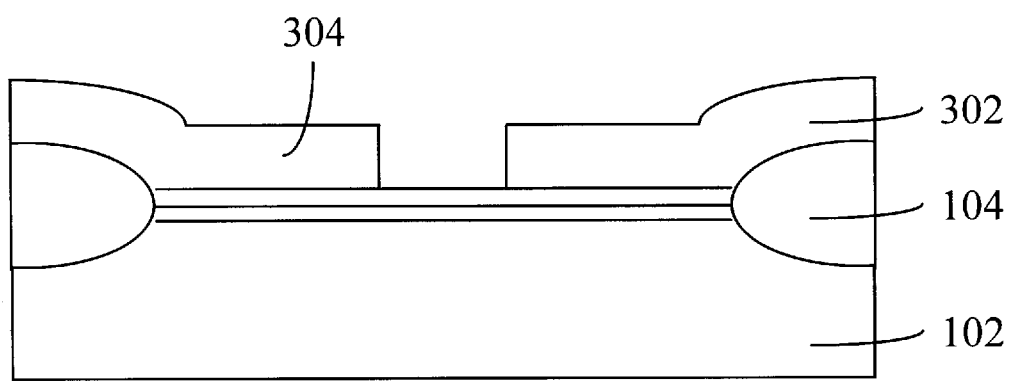
FIG. 3 is a schematic diagram of an etched silicon nitride layer according to the present invention.

FIG. 3 shows, in cross-section, an etched silicon nitride layer 302. Silicon nitride 302 is deposited by Low Pressure Chemical Vapor Deposition (LPCVD) or Plasma Enhanced Chemical Vapor Deposition (PECVD) and the thickness of a silicon nitride layer is about 500–3000 angstroms. The aperture 304 is for forming the T-gate region thereafter.

Figure 4:
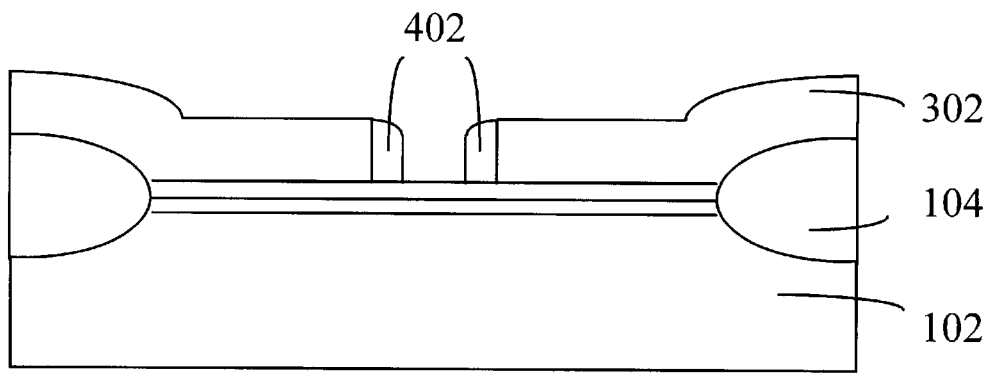
FIG. 4 is a schematic diagram, according to the present invention, of forming the polysilicon spacer structure.

FIG. 4 shows, in cross-section, a polysilicon spacer 402 formed on the side walls of silicon nitride 302. The process for forming the spacer 402 comprises the steps of depositing a polysilicon layer with CVD, vertically etching the polysilicon layer utilizing an anisotropic dry etching method, retaining the polysilicon layer below the silicon nitride layer 302, and etching other portions of the polysilicon layer to form the spacer 402.

Figure 5:
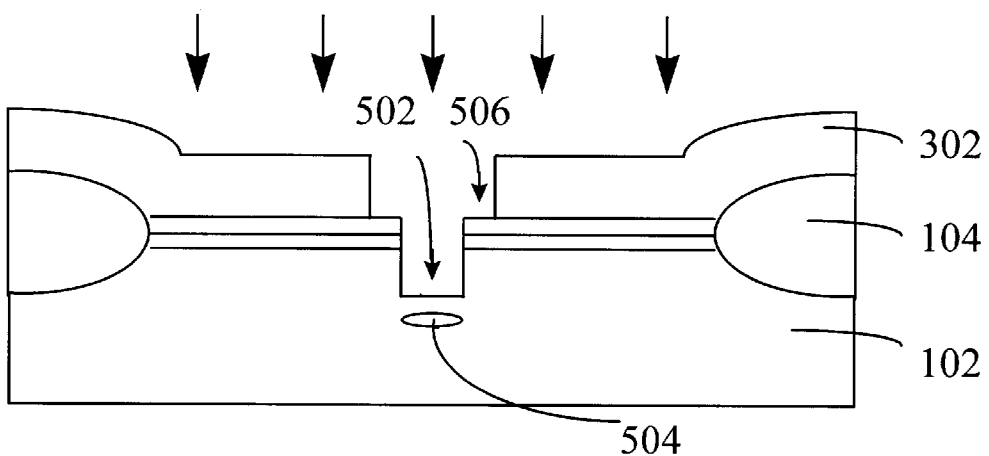
FIG. 5 is a schematic diagram, according to the present invention, of etching the recessed channel to form a T-shaped groove and an ion-implanting layer preventing the tunnel effect.

FIG. 5 shows the anisotropically etched pad oxide layer 106 and the silicon substrate 102 under aperture 304, forming a shallow groove 502 within the substrate. The polysilicon spacer 402 is removed during etching silicon substrate 102. It uses highly selective etching characteristics between polysilicon and silicon oxide to generate the protective layer of the pad oxide layer 106 under the spacer 402 which prevents silicon substrate 102 from being etched. Implanting boron ions or BF$_2$ into the shallow groove 502 to form an anti-punch through layer 504, which is available to reduce the leakage current between the source and drain. T-shaped groove 506, comprising the aperture 304 and the shallow groove 502, is to accept T-gate thereafter.

Figure 6:
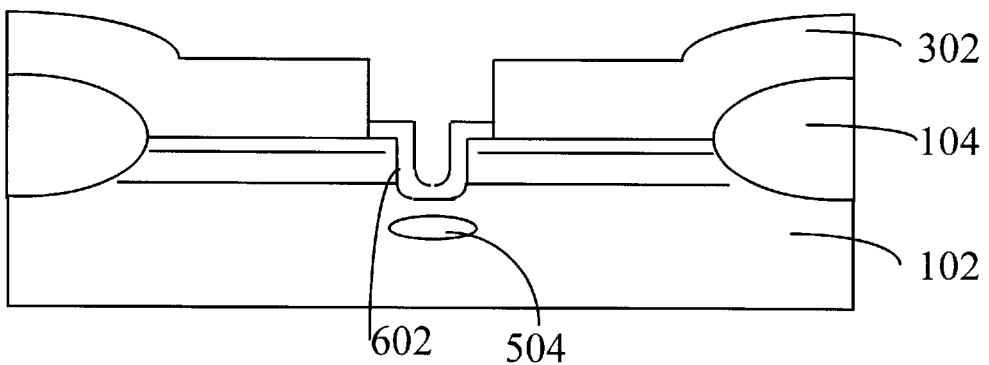
FIG. 6 is a schematic diagram, according to the presention invention, of annealing to recover etched defects.

FIG. 6 shows the thermal oxide layer 602 formed on the surface of substrate after the thermal annealing process. Because the surface of the substrate 102 is affected during polysilicon etching process, a thermal annealing process is used to rearrange the atoms for recovery of the crystal structure and rouden the trench corner to reduce leakge.

Figure 7:
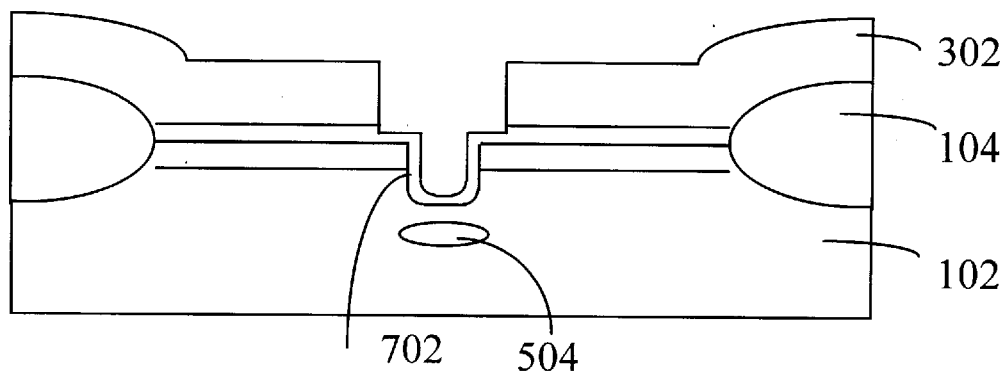
FIG. 7 is a schematic diagram, according to the present invention, of removing the silicon oxide layer growing in thermal oxidation process, and re-growing a silicon oxide layer.

FIG. 7 shows the cross-section of the thin oxide layer 702 on the gate region. A pad oxide layer 102 which is not under the shield of silicon nitride layer 302 is also etched away, during removing of the thermal oxide layer 602.

Figure 8:
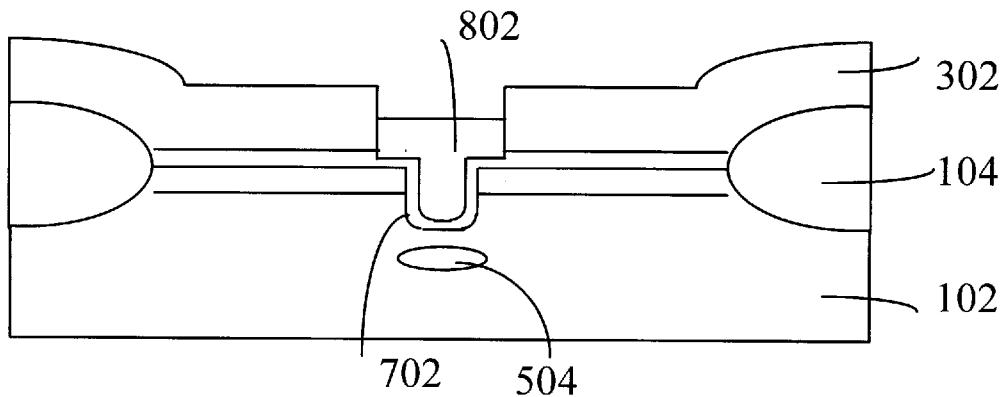
FIG. 8 is a schematic diagram, according to the present invention, of depositing amorphous silicon and etching amorphous silicon apart from the gate region.

FIG. 8 shows a cross-section of depositing of an amorphous silicon layer and etching amorphous silicon away from the gate region. It is difficult to fill polysilicon grains in a small aperture, because the polysilicon grain is larger than the amorphous silicon grain. Typically, amorphous silicon grains are used to fill in the small aperture, for forming an amorphous silicon gate 802 by CVD.

Figure 9:
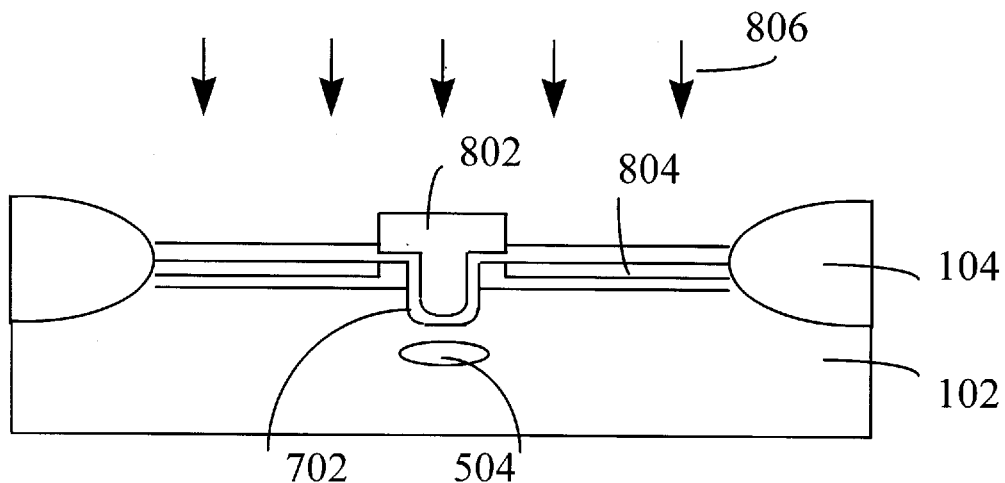
FIG. 9 is a schematic diagram, according to the present invention, of removing the silicon nitride layer, and forming the N+ or P+ heavily doped source / drain, utilizing the ion implantation method.

FIG. 9 shows the removing of the silicon nitride layer 302 after using hot phosphoric acid, retaining an amorphous silicon gate. While removing silicon nitride 302, the top surface of T-gate 802 is spoiled. Using a thermal annealing process recovers the damage surface of amorphous silicon T-gate 802. Arsenic atoms 806 are implanted in the substrate to form the N+ heavily doped source and drain 804. It makes the dopant homogeneous and deeply doped into substrate 102 utilizing the thermal diffusion process. The top of T-gate covering a part of the lightly doped layer 202 is the mask protecting the lightly doped layer 202 from the influence of heavily doped ion implantation, forming the LDD structure.

This method is applied not only in NMOS but also in PMOS (P-type Metal Oxide Semiconductor Transistor) and other semiconductor devices, e.g., CMOSFET (Complementary Metal Oxide Semiconductor Field Effect Transistor), etc.

What is claimed is:

1. A method for forming a self-aligned T-gate lightly-doped drain device with a recessed channel, comprising the steps of:
    (a) forming a pad oxide layer on a semiconductor substrate;
    (b) ion implanting a dopant into said substrate to form a lightly-doped layer adjacent to said pad oxide layer;
    (c) depositing a first insulation layer on said pad oxide layer;
    (d) forming an aperture having sidewalls in said first insulation layer;
    (e) forming side-wall spacers on the side walls of said aperture;
    (f) etching said substrate to form a groove by using said insulation layer and said side-wall spacers functioning as an etching mask and simultaneously etching said side-walls spacers;
    (g) forming a gate oxide layer on an area adjacent to and inside said groove which is not covered by said first insulation layer;
    (h) forming a gate-material layer over said first insulation layer, said gate-material layer filling into said aperture and said groove;
    (i) selectively etching said gate-material layer thereby removing said gate-material layer on said first insulation layer and retaining a portion of said gate-material layer in said aperture and said groove to form a T-gate having opposing sides;
    (j) removing said first insulation layer; and
    (k) forming a heavily-doped drain region in said lightly-doped layer on one side of said T-gate and a heavily-doped source region in said lightly-doped layer on the other side of said T-gate.

2. The method as recited in claim 1 wherein said gate layer is made of amorphous silicon.

3. The method as recited in claim 1 further comprising a step of a thermal annealing process after the process of etching said substrate to form a trench.

4. The method as recited in claim 3 further comprising a step of removing silicon oxide formed by the thermal annealing process.

5. The method as recited in claim 1 wherein said first insulation layer is made of silicon nitride.

6. The method as recited in claim 1 wherein said spacers are made of material selected from the group consisting of silicon oxide, amorphous silicon and silicon nitride.

7. The method as recited in claim 1 wherein said process for forming said spacers comprises the steps of:
    (a) depositing a second insulation layer; and
    (b) anisotropic etching said second insulation layer.

8. The method as recited in claim 1 wherein said process for forming said heavily doped drain and source regions utilizes an ion implantation method.

9. The method as recited in claim 1 further comprising a step of a thermal annealing process after forming said heavily doped drain and source regions.

10. The method as recited in claim 7 wherein said anisotropic etching method utilizes a reactive ion etching method or plasma etching method.

11. The method as recited in claim 1 wherein the dopant for forming said lightly doped layer is selected from the group consisting of phosphorus, arsenic, and boron difluoride.

12. The method as recited in claim 1 wherein the dopant for forming said heavily doped drain and source regions is selected from the group consisting of boron difluoride, arsenic and phosphorus.

13. The method as recited in claim 1 further comprising a step of forming an anti-punch through doped region under said groove.

14. The method as recited in claim 13 wherein the dopant of said anti-punch through region is selected from the group consisting of boron, boron difluoride, phosphorus and arsenic.

15. A method for forming a T-gate lightly-doped drain device, comprising the steps of:
   (a) forming a pad oxide layer on a substrate;
   (b) ion implanting a dopant into said substrate to form a lightly-doped layer adjacent to said pad oxide layer;
   (c) depositing a silicon nitride layer on said pad oxide layer;
   (d) forming an aperture having sidewalls exposing said pad oxide layer;
   (e) forming polysilicon spacers on the side walls of the aperture of said silicon nitride layer;
   (f) etching said pad oxide layer and said substrate to form a groove by using said silicon nitride layer and said polysilicon spacers functioning as an etching mask, and simultaneously etching said polysilicon spacers;
   (g) forming a gate oxide layer on an area adjacent to and inside said groove which is not covered by said silicon nitride layer;
   (h) filling amorphous silicon into said aperture and said groove and etching said amorphous silicon layer to form a T-gate having opposing sidewalls;
   (i) removing said silicon nitride layer; and
   (j) forming a heavily-doped drain region in said lightly-doped layer on one side of said T-gate and a heavily-doped source region in said lightly-doped layer on the other side of said T-gate.

16. The method as recited in claim 15 further comprising a step of doping boron dopant into said groove to form an anti-punch through region after the process of forming said groove.

17. The method as recited in claim 16 further comprising a step of thermal annealing after the step of etching said pad oxide layer and said substrate to form a groove.

18. The method as recited in claim 17 further comprising a step of removing an oxide layer formed by said thermal annealing process.

19. The method as recited in the claim 15 wherein said process for forming said polysilicon spacers comprises the steps of:
   (a) depositing a polysilicon layer; and
   (b) utilizing an anisotropic etching method to etch said polysilicon layer.

20. The method as recited in the claim 15 wherein said process for forming heavily doped drain and source regions is performed by ion implanting.

* * * * *